US011092633B2

(12) United States Patent
Shimada

(10) Patent No.: US 11,092,633 B2
(45) Date of Patent: Aug. 17, 2021

(54) CAPACITANCE DETECTION CIRCUIT, SEMICONDUCTOR DEVICE, INPUT DEVICE AND ELECTRONIC APPARATUS INCLUDING THE SAME, AND METHOD OF DETECTING CAPACITANCE

(71) Applicant: ROHM CO., LTD., Kyoto (JP)

(72) Inventor: Yuji Shimada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/275,834

(22) Filed: Feb. 14, 2019

(65) Prior Publication Data
US 2019/0257870 A1    Aug. 22, 2019

(30) Foreign Application Priority Data

Feb. 16, 2018 (JP) .............................. JP2018-025705

(51) Int. Cl.
| G06F 3/044 | (2006.01) |
| G06F 3/041 | (2006.01) |
| G01R 27/26 | (2006.01) |
| H03F 3/45 | (2006.01) |
| H03F 3/26 | (2006.01) |

(52) U.S. Cl.
CPC ......... *G01R 27/2605* (2013.01); *G06F 3/044* (2013.01); *G06F 3/0416* (2013.01); *G06F 3/04166* (2019.05); *H03F 3/45475* (2013.01); *G06F 3/04182* (2019.05); *H03F 3/265* (2013.01); *H03F 2200/129* (2013.01); *H03F 2203/45116* (2013.01); *H03F 2203/45512* (2013.01); *H03F 2203/45528* (2013.01)

(58) Field of Classification Search
CPC .............. G01R 27/2605; G06F 3/0416; G06F 3/04166; G06F 3/04182; G06F 3/044; H03F 3/45475; H03F 3/265; H03F 2203/45116; H03F 2203/45512; H03F 2203/45528; H03F 2200/129; H03F 3/70
See application file for complete search history.

(56) References Cited

U.S. PATENT DOCUMENTS

| 8,610,443 | B1 * | 12/2013 | Ryshtun | .............. | G06F 3/03545 |
| | | | | | 324/683 |
| 8,866,494 | B2 * | 10/2014 | Ryshtun | .............. | G06F 3/03545 |
| | | | | | 324/616 |
| 9,261,545 | B2 * | 2/2016 | Iwamoto | ............ | G01R 27/2605 |
| 9,436,325 | B2 * | 9/2016 | Morein | .................. | G06F 3/044 |
| 9,746,974 | B2 * | 8/2017 | Ellis | ...................... | G06F 3/0416 |

(Continued)

FOREIGN PATENT DOCUMENTS

| JP | 2001325858 A | 11/2001 |
| JP | 2012182781 A | 9/2012 |

*Primary Examiner* — Michael J Jansen, II
(74) *Attorney, Agent, or Firm* — Cantor Colburn LLP

(57) ABSTRACT

A capacitance detection circuit for measuring an electrostatic capacitance, includes: a control signal generator configured to generate a control signal; a drive circuit having a push-pull type output stage and configured to apply a drive voltage to the electrostatic capacitance according to the control signal; a current detection circuit configured to generate a detection current which is a replica of a current flowing through the output stage of the drive circuit; and an integrating circuit configured to integrate the detection current to generate a detection voltage.

17 Claims, 12 Drawing Sheets

(56) References Cited

U.S. PATENT DOCUMENTS

| | | | | |
|---|---|---|---|---|
| 9,778,804 | B2* | 10/2017 | Liu | G06F 3/044 |
| 9,954,476 | B2* | 4/2018 | Mishima | G06F 1/20 |
| 10,061,415 | B2* | 8/2018 | Bohannon | G06F 3/041 |
| 10,228,797 | B2* | 3/2019 | Roberson | G06F 3/0418 |
| 10,627,436 | B2* | 4/2020 | Chang | H03K 17/962 |
| 10,768,762 | B2* | 9/2020 | Bohannon | G06F 3/04166 |
| 10,831,323 | B2* | 11/2020 | Bohannon | G06F 3/0416 |
| 2012/0200306 | A1* | 8/2012 | Iwamoto | G01R 27/2605 |
| | | | | 324/658 |
| 2014/0267151 | A1* | 9/2014 | Ryshtun | G06F 3/0416 |
| | | | | 345/174 |
| 2015/0177868 | A1* | 6/2015 | Morein | G06F 3/044 |
| | | | | 345/174 |
| 2016/0054829 | A1* | 2/2016 | Ellis | G06F 3/0416 |
| | | | | 345/178 |
| 2016/0352279 | A1* | 12/2016 | Mishima | H02P 7/29 |
| 2016/0357299 | A1* | 12/2016 | Liu | G06F 3/044 |
| 2017/0075495 | A1* | 3/2017 | Roberson | G06F 3/0418 |
| 2018/0004317 | A1* | 1/2018 | Bohannon | G06F 3/041 |
| 2018/0172744 | A1* | 6/2018 | Chang | H03K 17/962 |
| 2018/0348954 | A1* | 12/2018 | Bohannon | G06F 3/0416 |
| 2019/0095002 | A1* | 3/2019 | Bohannon | G06F 3/0418 |
| 2019/0361545 | A1* | 11/2019 | Bohannon | G06F 3/04166 |

\* cited by examiner

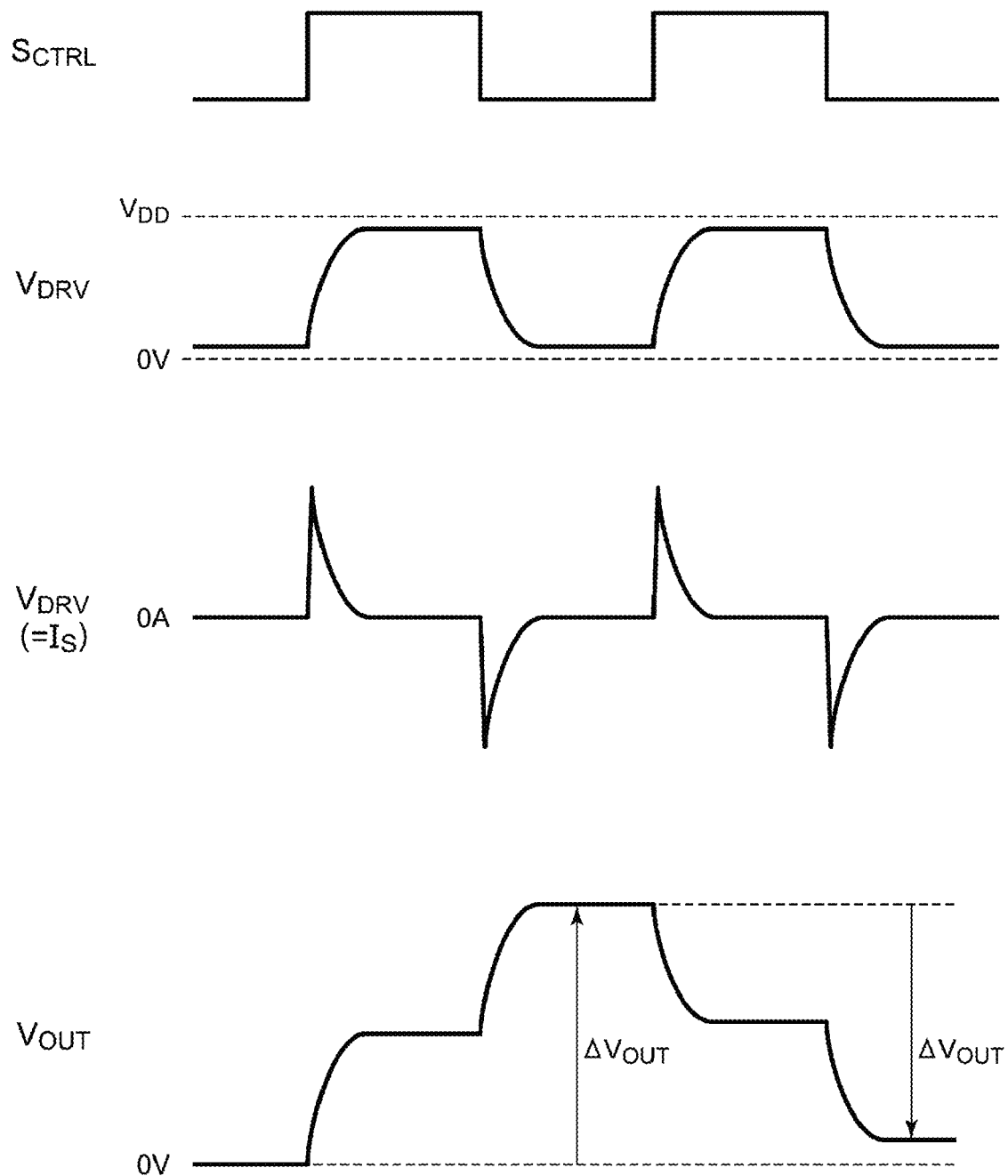

CAPACITANCE DETECTION CIRCUIT, SEMICONDUCTOR DEVICE, INPUT DEVICE AND ELECTRONIC APPARATUS INCLUDING THE SAME, AND METHOD OF DETECTING CAPACITANCE

CROSS-REFERENCE TO RELATED APPLICATION

The present invention claims priority under 35 U.S.C. § 119 to Japanese Patent Application No. 2018-025705, filed on Feb. 16, 2018, the entire contents of which are incorporated herein by reference.

TECHNICAL FIELD

The present disclosure relates to a technique for detecting electrostatic capacitance.

BACKGROUND

In recent years, electronic devices such as computers, smart phones, tablet terminals, and portable audio devices have been equipped with a touch type input device as a user interface. As touch type input devices, a touch pad, a pointing device, and the like are known and they make it possible to provide various inputs by bringing a finger or a stylus into contact with or proximity to the device.

The touch type input device may be generally classified into a resistance film type and an electrostatic capacitance type. The electrostatic capacitance type input device detects the presence or absence and a coordinate of a user input by converting a change in electrostatic capacitance (hereinafter also simply referred to as capacitance) formed by a sensor electrode into an electric signal in accordance with the user input.

Electrostatic capacitance measurement may be divided into a self-capacitance type and a mutual-capacitance type. In the related art, a capacitance detection circuit of a self-capacitance type is disclosed. FIG. 1 is a circuit diagram showing the basic configuration of a conventional self-capacitance type capacitance detection circuit 10 in the related art. The capacitance detection circuit 10 is a capacitance/voltage (CN) conversion circuit and generates a detection voltage $V_{OUT}$ according to an electrostatic capacitance Cs of a detection target connected to a sense terminal SNS.

The capacitance detection circuit 10 includes a charging circuit 20 and an integrating circuit 30. The charging circuit 20 charges the electrostatic capacitance Cs and outputs a detection current $I_S$ according to a charging current $I_{CHG}$ at that time. The integrating circuit 30 integrates the detection current $I_S$ to generate the detection voltage $V_{OUT}$.

The charging circuit 20 includes a first transistor $M_1$, a second transistor $M_2$, a reset switch $SW_1$, and a sense switch $SW_2$. The reset switch $SW_1$ initializes charges the electrostatic capacitance Cs. The first transistor $M_1$ and the sense switch $SW_2$ are connected in series between a power supply line $V_{DD}$ and the electrostatic capacitance Cs. The first transistor $M_1$ and the second transistor $M_2$ form a current mirror circuit.

The integrating circuit 30 integrates the detection current $I_S$ flowing through the second transistor $M_2$ and converts it into the detection voltage $V_{OUT}$. For example, the integrating circuit 30 includes an integrating capacitor $C_{INT}$ that is charged/discharged according to the detection current $I_s$.

The operation of capacitance measurement will be described below. FIG. 2 is an operation waveform diagram of the capacitance detection circuit 10 of FIG. 1.

1. Initialization Phase Ø1

First, the reset switch $SW_1$ is turned on, an amount of charges of the electrostatic capacitance Cs is reset to zero, and the voltage $V_{SNS}$ of the electrostatic capacitance Cs becomes zero. The reset switch $SW_1$ is turned off when the initialization is completed.

2. Sense Phase Ø2

Subsequently, the sense switch $SW_2$ is turned on. At this time, the charging current Taw flows through the first transistor $M_1$ to the electrostatic capacitance Cs, and the voltage $V_{SNS}$ of the electrostatic capacitance Cs rises. When the voltage $V_{SNS}$ reaches a certain upper limit voltage $V_{UPPER}$ near the power supply voltage, the charging stops. A charge amount Q supplied to the electrostatic capacitance Cs in the sense phase is expressed by the following equation.

$$Q = Cs \times V_{UPPER}$$

During the charging, the charging current $I_{CHG}$ is copied by the second transistor $M_2$ to generate the detection current Is. The detection voltage Vs, which is the integral amount of the detection current Is, represents the charged charge amount Q of the electrostatic capacitance Cs.

$$V_S = Q = Cs \times V_{UPPER}$$

Since the upper limit voltage $V_{UPPER}$ can be treated as a constant, the detection voltage Vs represents the capacitance value of the electrostatic capacitance Cs.

As a result of examination on the capacitance detection circuit 10 of FIG. 1, the present inventors have recognized the following problems.

First Problem

In the capacitance detection circuit 10 of FIG. 1, since a gate and a drain of the first transistor $M_1$ are connected, the upper limit voltage $V_{UPPER}$ is $V_{DD}$–$V_{HR}$. $V_{HR}$ is a headroom voltage. In the circuit of FIG. 1, $V_{HR}$ is defined by a threshold value of the gate-drain voltage of the first transistor $M_1$ (a forward voltage VF of a diode) and is, for example, about 0.6V. When the power supply voltage $V_{DD}$ is sufficiently high, there is not a big problem. However, when the power supply voltage $V_{DD}$ is lowered, an influence of the headroom voltage Vim becomes large.

Second Problem

The charging current $I_{CHG}$ flowing through the charging circuit 20 of FIG. 1 is very steep as shown in FIG. 2 and includes very high frequency components. On the other hand, in a current including the detection current Is, a parasitic capacitance (not shown) exists, forming a parasitic low-pass filter. When high frequency components of the detection current $I_S$ are removed by this low-pass filter, the information of the peak portion of the charging current $I_{CHG}$ in FIG. 2 is lost, which may result in deterioration of accuracy in capacitance detection.

Third Problem

In the sense phase, the charging circuit 20 is only capable of performing a charging operation and has an asymmetry. Because of this asymmetry, when an AC noise is input to the sense terminal SNS, the detection current $I_S$ is influenced by a half wave in the noise, which makes it difficult to make a determination as to whether it is a noise component or a component due to capacitance change.

Fourth Problem

In the capacitance detection circuit 10 of FIG. 1, the electrostatic capacitance Cs is detected only by the charging operation. Since discharge in the initialization phase Ø1 does not contribute to sensing, power is wastefully consumed.

SUMMARY

Some embodiments of the present disclosure provide a capacitance detection circuit capable of solving at least one of the above-described problems.

According to an embodiment of the present disclosure, there is provided a capacitance detection circuit for measuring an electrostatic capacitance. The capacitance detection circuit includes: a control signal generator configured to generate a control signal; a drive circuit having a push-pull type output stage and configured to apply a drive voltage to the electrostatic capacitance according to the control signal; a current detection circuit configured to generate a detection current which is a replica of a current flowing through the output stage of the drive circuit; and an integrating circuit configured to integrate the detection current to generate a detection voltage.

Any combinations of the above-described elements or changes of the representations of the present disclosure between methods, apparatuses and the like are effective as embodiments of the present disclosure.

BRIEF DESCRIPTION OF DRAWINGS

FIG. 7 is a waveform diagram showing a second operation example of the capacitance detection circuit of FIG. 3.

DETAILED DESCRIPTION

Outline of Embodiments

Figure 1:
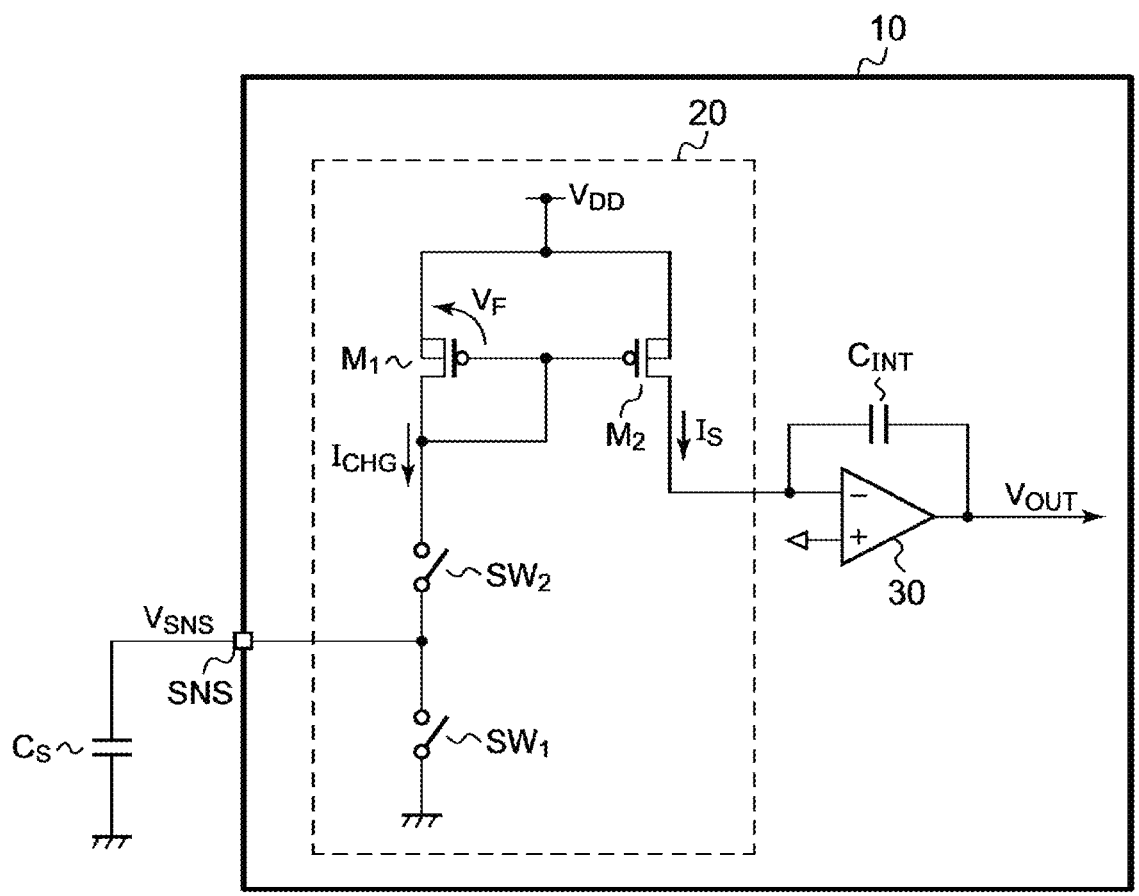
FIG. 1 is a circuit diagram showing a basic configuration of a conventional self-capacitance type capacity detection circuit in the related art.
Figure 2:
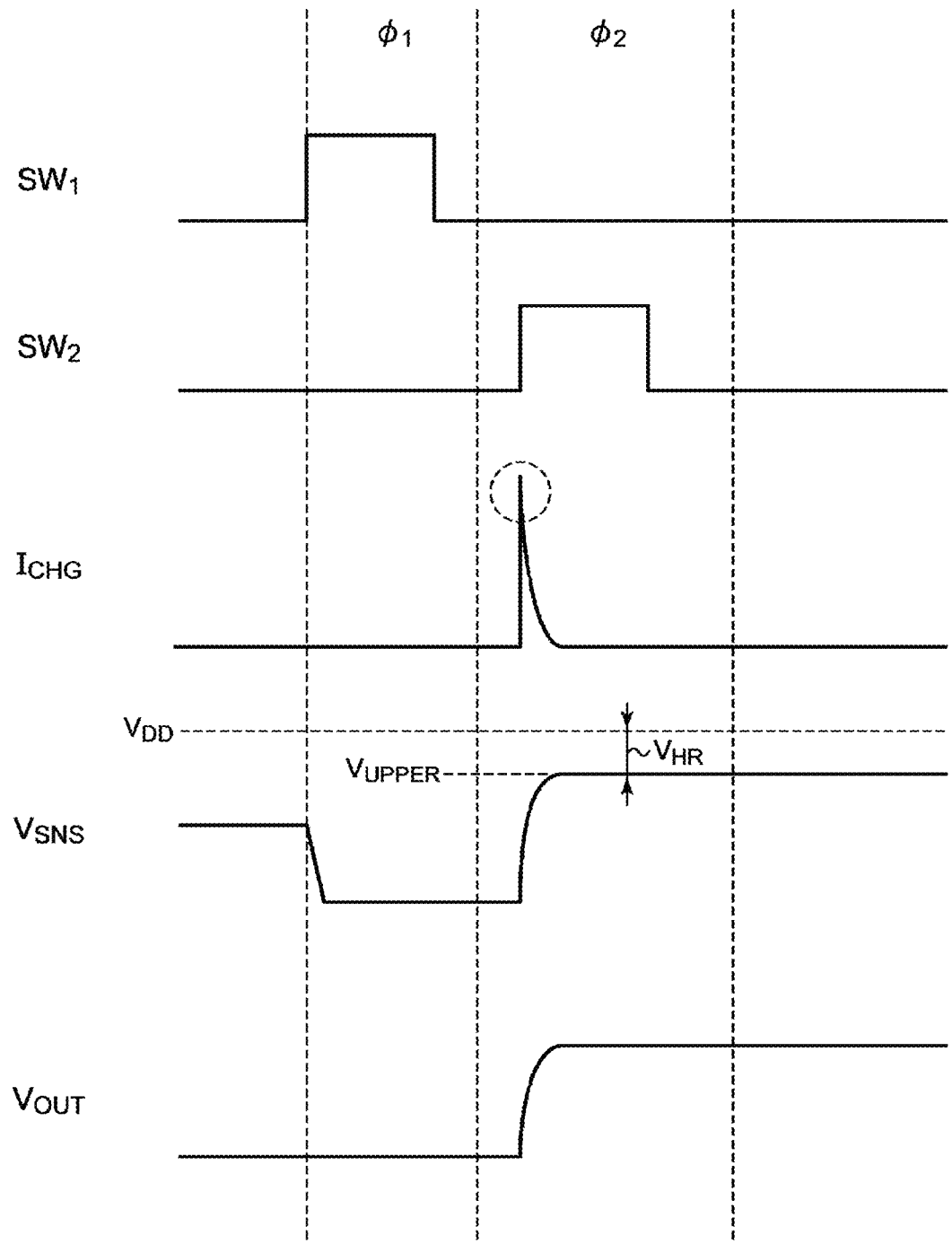
FIG. 2 is an operation waveform diagram of the capacitance detection circuit of FIG. 1.

One embodiment disclosed herein relates to a capacitance detection circuit for measuring an electrostatic capacitance. The capacitance detection circuit includes a control signal generator configured to generate a control signal, a drive circuit having a push-pull type output stage and configured to apply a drive voltage to the electrostatic capacitance according to the control signal, a current detection circuit configured to generate a detection current which is a replica of a current flowing through the output stage of the drive circuit, and an integrating circuit configured to generate a detection voltage by integrating the detection current.

According to this embodiment, at least one of the following advantages can be achieved.

Since it is unnecessary to diode-connect the transistor of the output stage, the headroom can be made small, thereby improving the accuracy of capacitance detection.

The voltage of the electrostatic capacitance can be slightly blunted by a response delay of the drive circuit. Thus, since a steep change in a charging current and a discharging current can be suppressed, the influence of a parasitic capacitance on a signal propagation path can be reduced.

Since the drive circuit can perform a push-pull operation, when AC noise is input, the influence of the AC noise appears as it is in the detection current. This noise is easily removed by a filter. In addition, since the noise becomes zero when it is integrated for one period, resistance to the noise can be enhanced.

Since both charging and discharging operations can be assigned to sensing, wasteful power consumption can be reduced. It is also possible to increase the accuracy of sensing or a frequency of sensing.

The control signal may be a pulse signal, and the drive circuit may include an amplifier that receives the pulse signal. The amplifier may be one of a buffer (voltage follower), a non-inverting amplifier, and an inverting amplifier.

The integrating circuit may integrate the detection current obtained during charging and the detection current obtained during discharging.

The electrostatic capacitance may be obtained by calculating a difference between the detection voltage obtained during charging and the detection voltage obtained during discharging.

The drive circuit may further include a differential input stage for controlling a high-side transistor and a low-side transistor of the output stage so that a feedback signal corresponding to an output voltage of the drive circuit matches the control signal, a first transistor having a control terminal connected in common with the high-side transistor, and a second transistor having a control terminal connected in common with the low-side transistor. The detection current may depend on a difference between a current flowing through the first transistor and a current flowing through the second transistor.

The capacitance detection circuit may further include an offset capacitor having one end connected to the input of the integrating circuit. A correction signal according to the control signal may be applied to the other end of the offset capacitor. As a result, the detection signal can be offset.

The capacitance detection circuit may be integrated on a single semiconductor integrated circuit. As used herein, the term "integrated" is intended to include both a case where all elements of a circuit are formed on a semiconductor substrate and a case where main elements of the circuit are integrated on the semiconductor substrate, and some resistors, capacitors, and the like for adjustment of a circuit constant may be provided outside the semiconductor substrate. By integrating the circuit on one chip, a circuit area can be reduced and the characteristics of the circuit elements can be kept uniform.

Another embodiment disclosed herein relates to a semiconductor device capable of measuring a plurality of electrostatic capacitances. The semiconductor device may include a plurality of sense terminals to which the plurality of electrostatic capacitances are connected, and a plurality of capacitance detection circuits corresponding to the plurality of sense terminals.

The semiconductor device may further include a current averaging circuit configured to generate an average current of a plurality of detection currents obtained by the plurality of capacitance detection circuits. The integrating circuit of each capacitance detection circuit may integrate a difference between the corresponding detection current and the average current. As a result, it is possible to detect a relative variation amount of each electrostatic capacitance.

Another embodiment disclosed herein relates to an input device. The input device may include a touch type sensor including a plurality of sensor electrodes, wherein the electrostatic capacitance of a sensor electrode in the vicinity of a coordinate touched by a user changes, and a semiconductor device configured to measure capacitance of the plurality of sensor electrodes.

Embodiments

Embodiments of the present disclosure will now be described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not substantially affect an electrical connection state between the members A and C or the members B and C or does not impair function and effects achieved by combinations of the members A and C or the members B and C, in addition to a case where the member A and the member C or the member B and the member C are directly connected.

Figure 3:
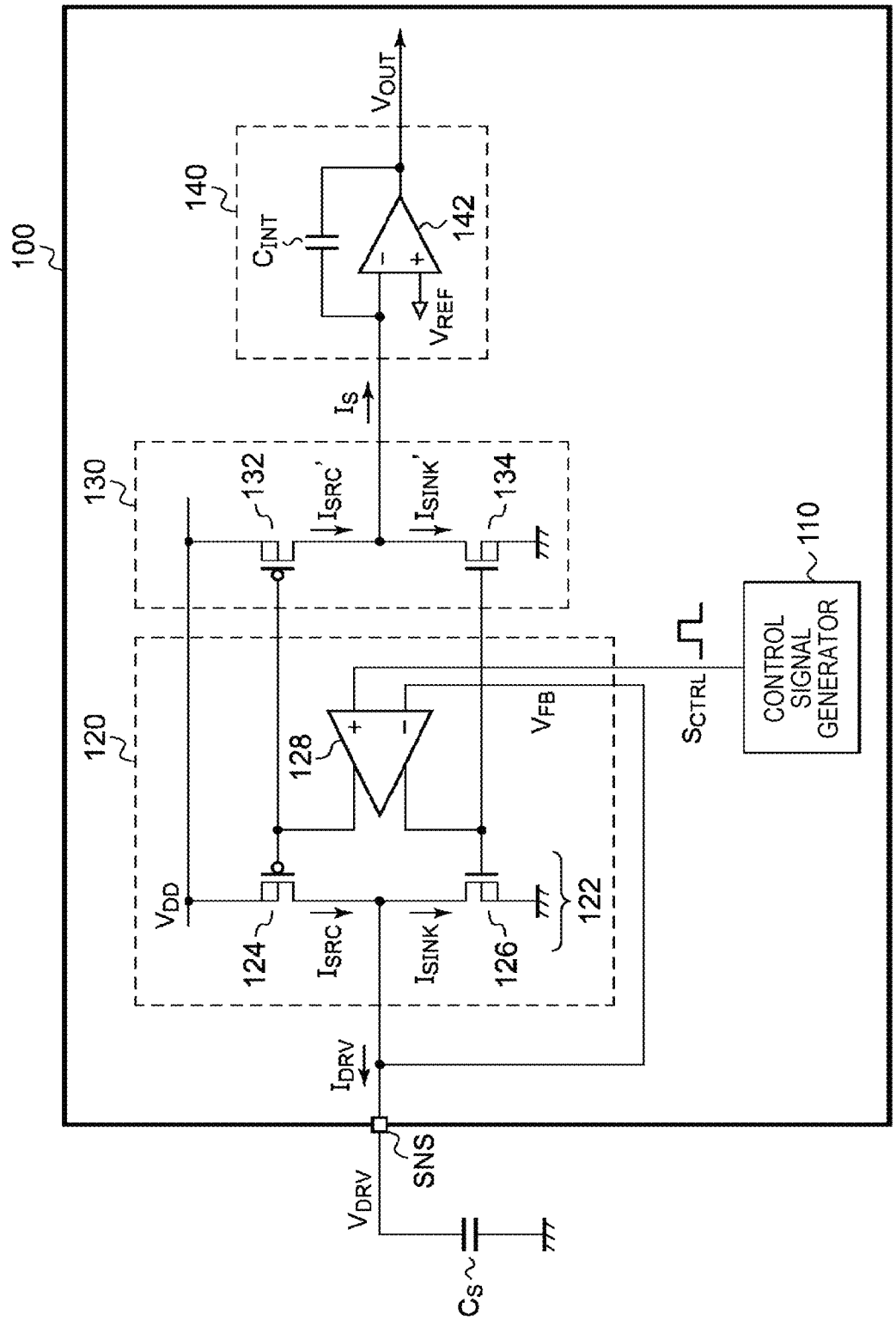
FIG. 3 is a circuit diagram of a capacitance detection circuit according to an embodiment of the present disclosure.

FIG. 3 is a circuit diagram of a capacitance detection circuit 100 according to an embodiment. The capacitance detection circuit 100 measures an electrostatic capacitance Cs by a self capacitance method to generate a detection voltage $V_{OUT}$ indicating the electrostatic capacitance Cs. The capacitance detection circuit 100 is integrated on one semiconductor substrate, and the electrostatic capacitance Cs is connected to a sense terminal (sense pin) SNS.

A control signal generator 110 generates a control signal $S_{CTRL}$. The control signal $S_{CTRL}$ may be obtained by using, but is not limited to, a pulse and may be obtained by using a trapezoidal wave.

A drive circuit 120 includes a push-pull type output stage 122. The drive circuit 120 applies a drive voltage $V_{DRV}$ to the electrostatic capacitance Cs in response to the control signal $S_{CTRL}$. A drive current $I_{DRV}$ corresponding to a change in voltage of the electrostatic capacitance Cs (voltage of the sense terminal) flows through the output stage 122. The drive current $I_{DRV}$ is a difference between a source current $I_{SRC}$ flowing through a high-side transistor 124 of the output stage 122 and a sink current $I_{SINK}$ flowing through a low-side transistor 126.

The drive circuit 120 can be constituted by an operational amplifier including a differential input stage 128 at the front stage and an output stage 122 at the subsequent stage. The differential input stage 128 controls each of the high-side transistor 124 and the low-side transistor 126 of the output stage 122 so that a feedback signal $V_{FB}$ corresponding to the drive voltage $V_{DRV}$ matches the control signal $S_{CTRL}$.

Figure 4A:
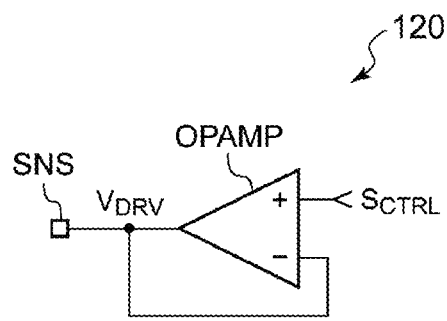
FIG. 4A to FIG. 4C are circuit diagrams of a drive circuit.
Figure 4B:
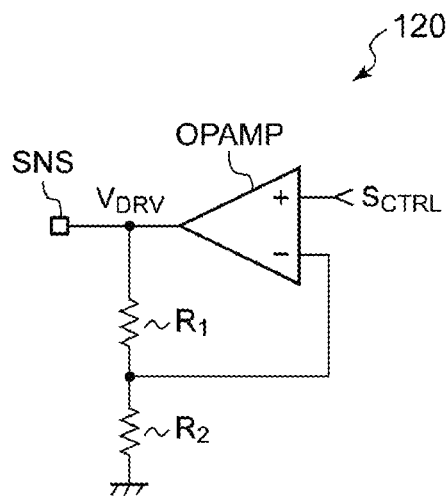
Figure 4C:
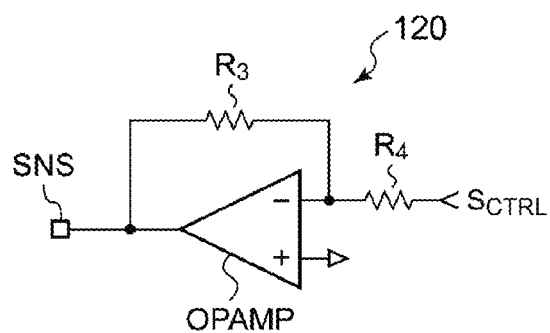

FIG. 4A to FIG. 4C are circuit diagrams of the drive circuit 120. The drive circuit 120 of FIG. 4A is a buffer amplifier (voltage follower) in which the output of an operational amplifier OPAMP1 and an inverting input terminal are connected and the control signal $S_{CTRL}$ is input to a non-inverting input terminal.

The drive circuit 120 in FIG. 4B is a non-inverting amplifier and includes feedback resistors $R_1$ and $R_2$ in addition to the operational amplifier OPAMP1. The drive circuit 120 of FIG. 4C is an inverting amplifier and includes resistors $R_3$ and $R_4$ in addition to the operational amplifier OPAMP1. It should be noted that the configuration of the drive circuit 120 is not limited to those illustrated here.

Returning to FIG. 3, a current detection circuit 130 generates a detection current $I_S$ which is a replica of the drive current $I_{DRV}$ flowing in the output stage of the drive circuit 120. The detection current $I_S$ may be equal to the drive current $I_{DRV}$ or may be scaled.

The current detection circuit 130 includes a first transistor 132 and a second transistor 134. The first transistor 132 is a P-channel MOS transistor of the same type as the high-side transistor 124, and control terminals (gates) thereof are connected in common. A current $I_{SRC}'=k \times I_{SRC}$ proportional to the source current $I_{SRC}$ flowing through the high-side transistor 124 flows through the first transistor 132. The second transistor 134 is of the same type as the low-side transistor 126, and control terminals (gates) thereof are connected in common. A current $I_{SINK}'=k \times I_{SINK}$ proportional to the sink current $I_{SINK}$ flowing through the low-side transistor 126 flows through the second transistor 134.

The drain of the first transistor 132 and the drain of the second transistor 134 are connected to the output node of the current detection circuit 130. The detection current Is generated by the current detection circuit 130 is expressed by the following equation.

$$I_S = I_{SRC}' - I_{SINK}'$$

The integrating circuit 140 integrates the detection current $I_S$ to generate a detection voltage $V_{OUT}$. The integrating circuit 140 is not particularly limited in its configuration but may include, for example, an integrating capacitor $C_{INT}$ and an operational amplifier 142. The integrating capacitor CINT is interposed between the output terminal and the inverting input terminal of the operational amplifier 142.

The above is the configuration of the capacitance detection circuit 100. Next, the operation thereof will be explained.

First Operation Example

Figure 5:
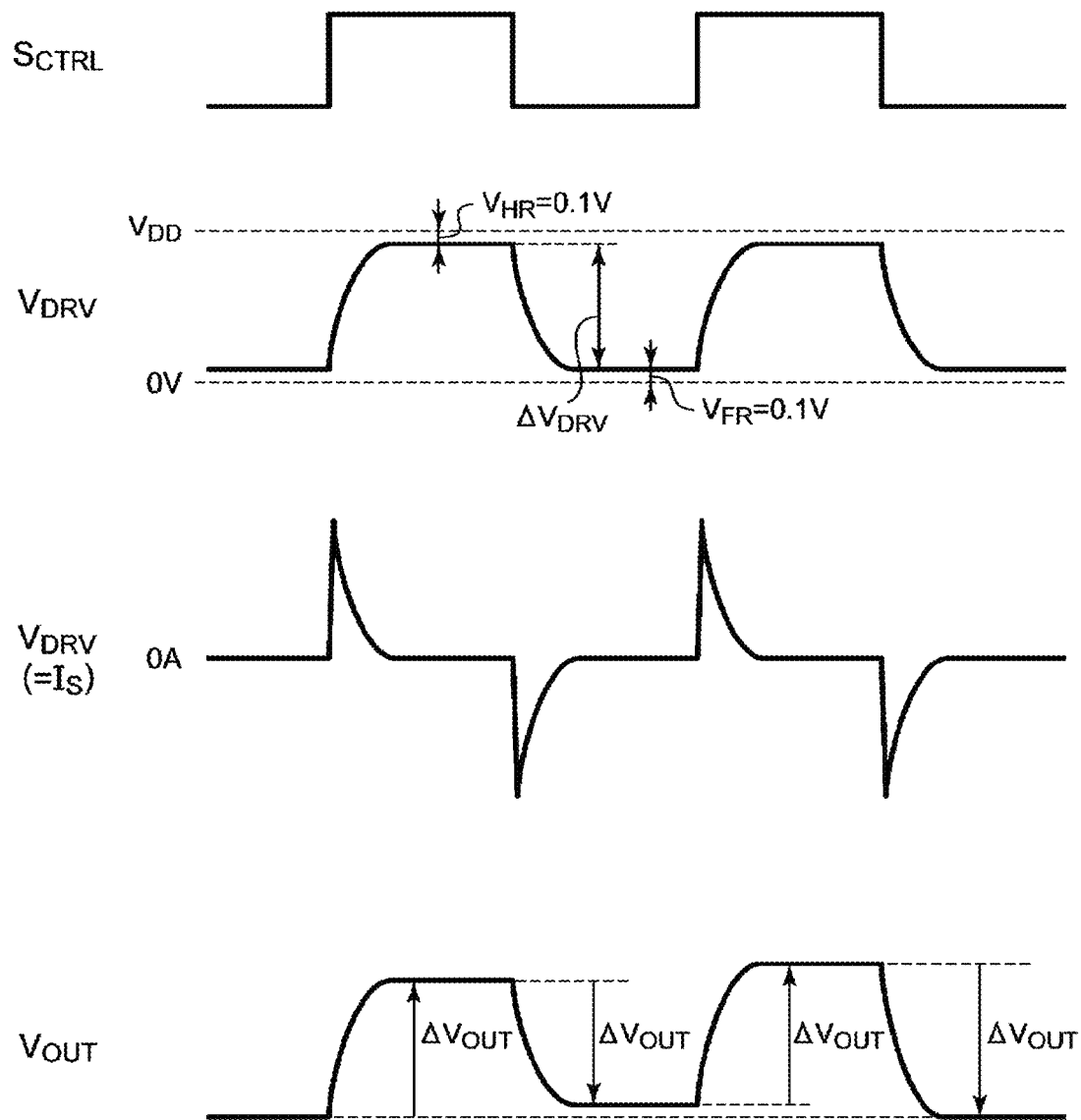
FIG. 5 is a waveform diagram showing a first operation example of the capacitance detection circuit of FIG. 3.

FIG. 5 is a waveform diagram showing a first operation example of the capacitance detection circuit 100 of FIG. 3. In the first operation example, a difference between a detection voltage $V_{OUT}[i]$ obtained during charging (or discharging) and a detection voltage $V_{OUT}[i+1]$ obtained during discharging (or charging) is calculated to acquire an electrostatic capacitance Cs[i], as will be described in detail below.

A control signal $S_{CTRL}$ is a pulse signal that alternates between high and low. The drive circuit 120 generates a drive voltage $V_{DRV}$ corresponding to the control signal $S_{CTRL}$ at the sense terminal. The drive voltage $V_{DRV}$ generated at the sense terminal may have a waveform that is more blunted than that of the control signal $S_{CTRL}$ due to a response delay of the drive circuit 120.

When the drive voltage $V_{DRV}$ rises, the drive circuit 120 sources an output current $I_{DRV}$ ($I_{DRV}>0$). When the drive voltage $V_{DRV}$ drops, the drive circuit 120 sinks the output current $I_{DRV}$ ($I_{DRV}<0$).

The current detection circuit 130 generates a detection current $I_S$ which is a replica of the output current $I_{DRV}$. The detection current $I_S$ is integrated by the integrating circuit 140 at the subsequent stage and is converted into a detection voltage $V_{OUT}$. The variation width $\Delta V_{OUT}$ of the detection voltage $V_{OUT}$ generated at each edge of the control signal $S_{CTRL}$ represents the charge amount Q supplied to the electrostatic capacitance Cs in one charging operation (or discharging operation).

On the other hand, a variation width $\Delta V_{DRV}$ of the drive voltage $V_{DRV}$ in one charging operation (or discharging operation) is expressed by $\Delta V_{DRV}=V_{DDZ}-V_{HR}-V_{FR}$ and may be regarded as a constant. $V_{HR}$ is a headroom voltage mainly determined by a saturation voltage of the high-side transistor 124, and $V_{FR}$ is a footroom voltage mainly determined by a saturation voltage of the low-side transistor 126.

When the capacitance at the time of i-th charging (or discharging) is denoted by Cs[i], a charge amount of charging (or discharging) Q[i] is expressed by Q[i]=Cs[i]×$\Delta V_{DRV}$. Since the variation width $\Delta V_{OUT}$[i] of the output voltage $V_{OUT}$ obtained in the i-th charging (or discharging) represents the charge amount of charging (or discharging), the following equation (1) is established.

$$\Delta V_{OUT}[i]=Cs[i]\times\Delta V_{DRV} \quad (1)$$

Since $\Delta V_{DRV}$ is a constant, $\Delta V_{OUT}$[i] represents the electrostatic capacitance Cs[i].

The above is the first operation example of the capacitance detection circuit 100.

Figure 6A:
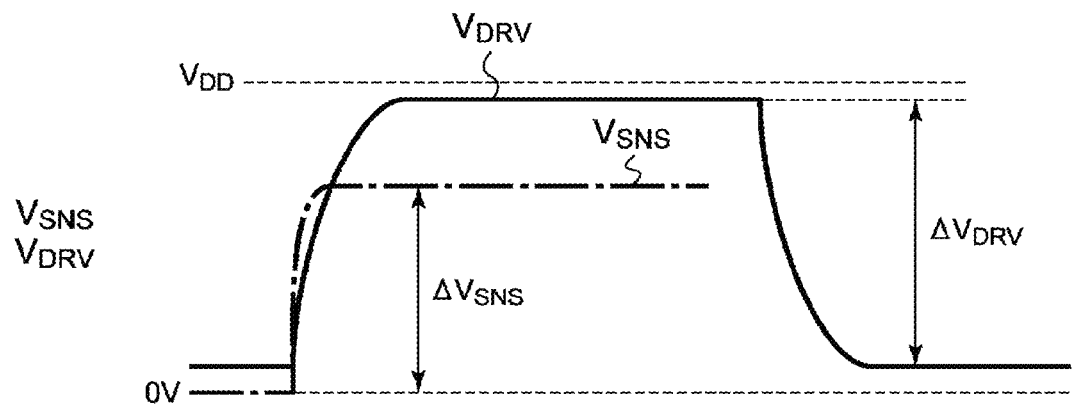
FIG. 6A and FIG. 6B are enlarged views of a voltage waveform and a current waveform, respectively.
Figure 6B:
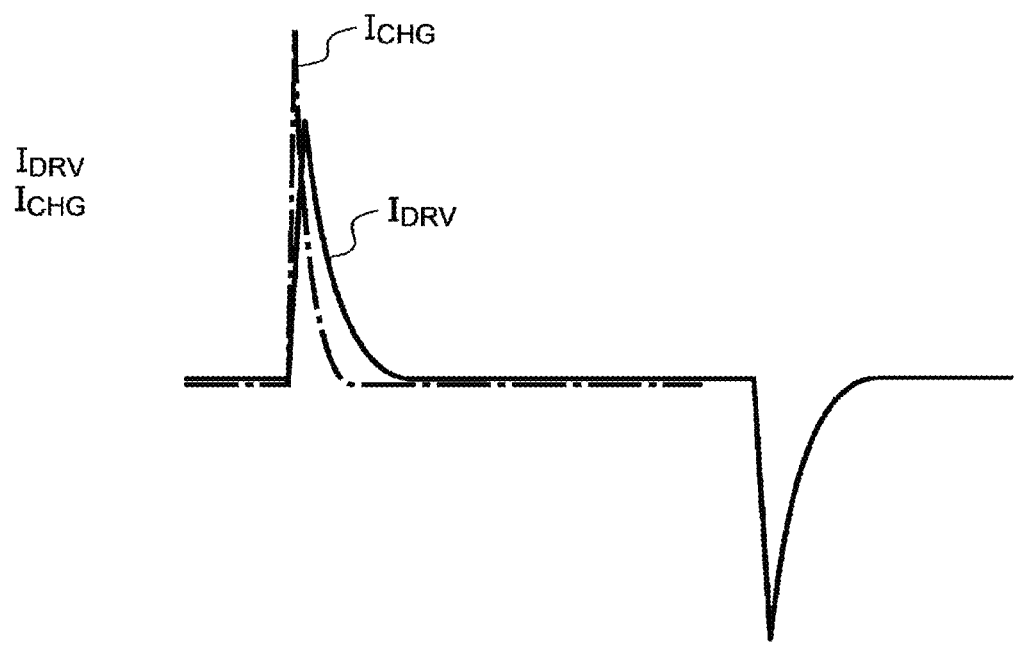

Next, advantages of the capacitance detection circuit 100 will be described. FIG. 6A and FIG. 6B are enlarged views of a voltage waveform and a current waveform, respectively.

First Advantage

FIG. 6A shows a drive voltage $V_{DRV}$ of the sense terminal. For comparison, the voltage $V_{SNS}$ of the sense terminal in the capacitance detection circuit 10 of FIG. 1 is indicated by a dash-dotted line. The headroom voltage of the sense terminal voltage $V_{SNS}$ is about 0.6V defined by the gate-source voltage of the transistor $M_1$. When the power supply voltage $V_{DD}$ is 1.5V, the voltage variation width $\Delta V_{SNS}$ of the sense terminal is $V_{DD}-V_{HR}=0.9V$.

On the other hand, the headroom voltage $V_{HR}$ of the drive voltage $V_{DRV}$ of the capacitance detection circuit 100 of FIG. 3 can be reduced to about 0.1V. Although the comparable footroom voltage $V_{FR}$ is introduced, the variation width $\Delta V_{DRV}$ of the drive voltage $V_{DRV}$ is $V_{DD}-V_{HR}-V_{FR}=1.5V-0.1V-0.1V=1.3V$, which is enlarged as compared with FIG. 1.

As is apparent from the equation (1), detection sensitivity of the electrostatic capacitance Cs increases as $\Delta V_{DRV}$ increases. Therefore, according to the capacitance detection circuit 100 of FIG. 3, the detection sensitivity can be enhanced.

Second Advantage

FIG. 6B shows a drive current $I_{DRV}$. For comparison, a charging current $I_{CHG}$ flowing through the charging circuit 20 of FIG. 1 is indicated by a dash-dotted line. This charging current $I_{CHG}$ is very steep and contains a high frequency component. The high frequency component is filtered by a parasitic low-pass filter in the process of converting the charging current $I_{CHG}$ into the detection signal Is and further converting it into the detection signal $V_{OUT}$, resulting in deterioration of the detection accuracy.

On the other hand, in the capacitance detection circuit 100 of FIG. 3, a change speed (slew rate) of the drive voltage $V_{DRV}$ is limited due to a response speed of the drive circuit 120, and a frequency component included in the drive current $I_{DRV}$ is shifted to the low frequency side. Therefore, in the process of converting the drive current $I_{DRV}$ into the detection signal Is and further converting it into the detection signal $V_{OUT}$, a component lost by filtering decreases, and the decrease in the detection accuracy can be suppressed. In addition, this effect may be further enhanced by limiting the slope of the control signal $S_{CTRL}$.

Third Advantage

In FIG. 1, the charging circuit 20 is only capable of charging operation and has an asymmetry. Due to this asymmetry, when an AC noise N is input to the sense terminal SNS, the detection current $I_S$ is influenced by a half wave in the noise. Therefore, the influence of the noise half wave appears also in the detection voltage $V_{OUT}$, which makes it difficult to filter out the noise component.

On the other hand, in FIG. 3, since the drive circuit 120 is capable of push-pull operation, when an AC noise is input, the influence of the AC noise appears as it is in the detection current $I_S$. The noise contained in the detection current $I_S$ can be easily removed by a filter and becomes zero when it is integrated for one period. Therefore, according to the capacitance detection circuit 100 of FIG. 3, resistance to noise can be enhanced.

Fourth Advantage

In the capacitance detection circuit 10 of FIG. 1, the discharging is used for resetting and power is consumed wastefully. On the other hand, according to the capacitance detection circuit 100 of FIG. 3, since it is operated as shown in FIG. 5, the electrostatic capacitance Cs can be detected in each of the charging operation and the discharging operation. Therefore, the wasteful power consumption can be reduced.

Fifth Advantage

In addition, by sensing the electrostatic capacitance Cs in each of charging and discharging, it is possible to double the sensing frequency.

Sixth Advantage

The output impedance of the drive circuit 120 becomes lower than the output impedance of the charging circuit in the capacitance detection circuit 10 of FIG. 1. This makes it possible to enhance noise resistance.

Second Operation Example

FIG. 7 is a waveform diagram showing a second operation example of the capacitance detection circuit 100 of FIG. 3. In the second operation example, one set of charging and discharging is one detection cycle. The integrating circuit 140 integrates the detection current Is during charging and the detection current $I_S$ during discharging with the same polarity.

The variation width $\Delta V_{OUT}$ of the detection voltage $V_{OUT}$ generated by one charging and one discharging represents the electrostatic capacitance Cs. In this example, a direction of changing the detection voltage $V_{OUT}$ is reversed every detection cycle.

Figure 8:
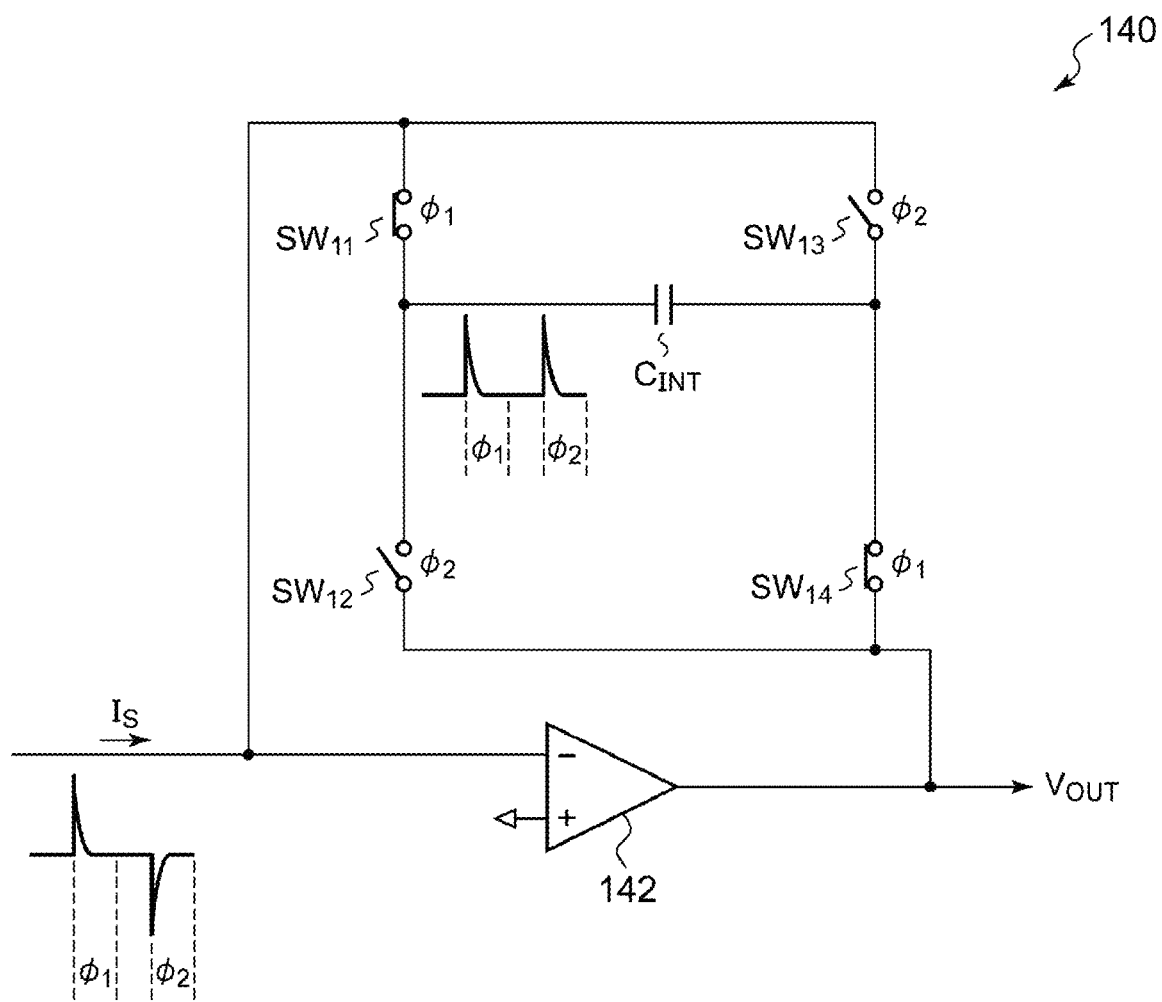
FIG. 8 is a circuit diagram of an integrating circuit corresponding to the second operation example.

FIG. 8 is a circuit diagram of the integrating circuit 140 corresponding to the second operation example. A plurality of switches $SW_{11}$ to $SW_{14}$ is added to the integrating circuit 140. The switches $SW_{11}$ to $SW_{14}$ can switch connection between the integrating capacitor $C_{INT}$ and the operational amplifier 142.

In a detection cycle in which the detection voltage $V_{OUT}$ is increased, in the charging phase Ø1, the switches $SW_{11}$ and $SW_{14}$ are turned on, and the remaining switches $SW_{12}$ and $SW_{13}$ are turned off. Conversely, in the discharging phase Ø2, the switches $SW_{11}$ and $SW_{14}$ are turned off, and the remaining switches $SW_{12}$ and $SW_{13}$ are turned on.

In a detection cycle in which the detection voltage $V_{OUT}$ is decreased, the state of the switches may be reversed.

In FIG. 7, the direction in which the detection voltage $V_{OUT}$ is changed is reversed for each detection cycle, but it is not limited thereto. Each time one detection cycle is completed, it is also possible to initialize the charges of the integrating capacitor $C_{INT}$ and to reset the output voltage $V_{OUT}$ to zero so that the detection voltage $V_{OUT}$ is always oriented in the same direction.

Figure 9:
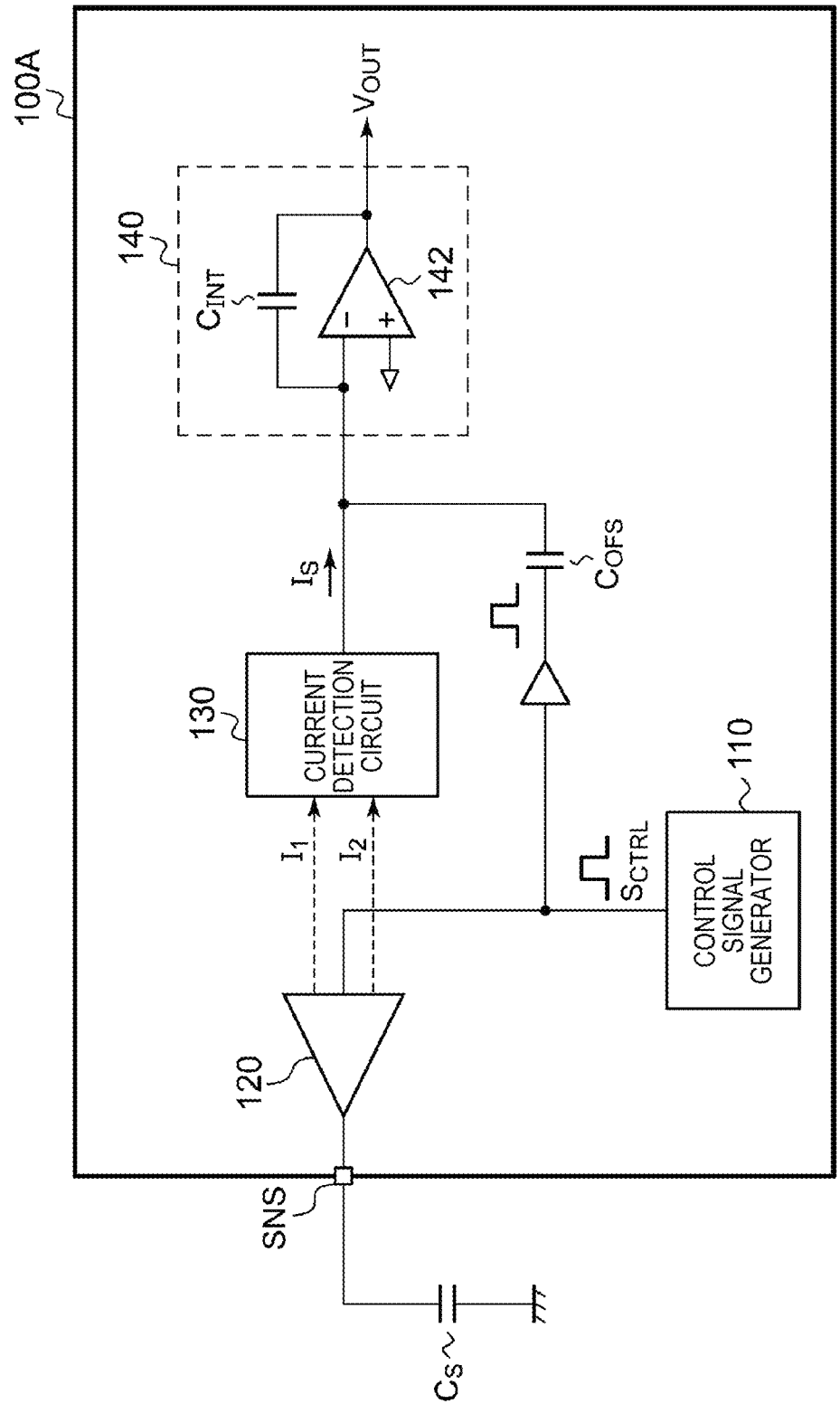
FIG. 9 is a circuit diagram of a capacitance detection circuit according to a modification.

FIG. 9 is a circuit diagram of a capacitance detection circuit 100A according to a modification. The capacitance detection circuit 100A further includes an offset capacitor $C_{OFS}$ in addition to the capacitance detection circuit 100 of FIG. 3. The offset capacitor $C_{OFS}$ has one end connected to the input of the integrating circuit 140, and the other end to which a correction signal corresponding to the control signal $S_{CTRL}$ is applied.

This offset capacitor $C_{OFS}$ is provided to offset the detection signal $V_{OUT}$ by a voltage width corresponding to the offset capacitor $C_{OFS}$.

For example, in an application such as a touch panel to be described later, there is a case where it is desired to acquire an amount of displacement from a reference value rather than capacitance itself of the electrostatic capacitance Cs. Therefore, by defining the capacitance value of the offset capacitor $C_{OFS}$ corresponding to the reference value, the detection signal $V_{OUT}$ indicating the displacement amount can be obtained.

Alternatively, in addition to the electrostatic capacitance Cs, a parasitic capacitance may be connected to the sense terminal SNS to eliminate the influence thereof. Therefore, by defining the capacitance of the offset capacitor $C_{OFS}$ according to the parasitic capacitance, the influence of the parasitic capacitance can be reduced.

Figure 10:
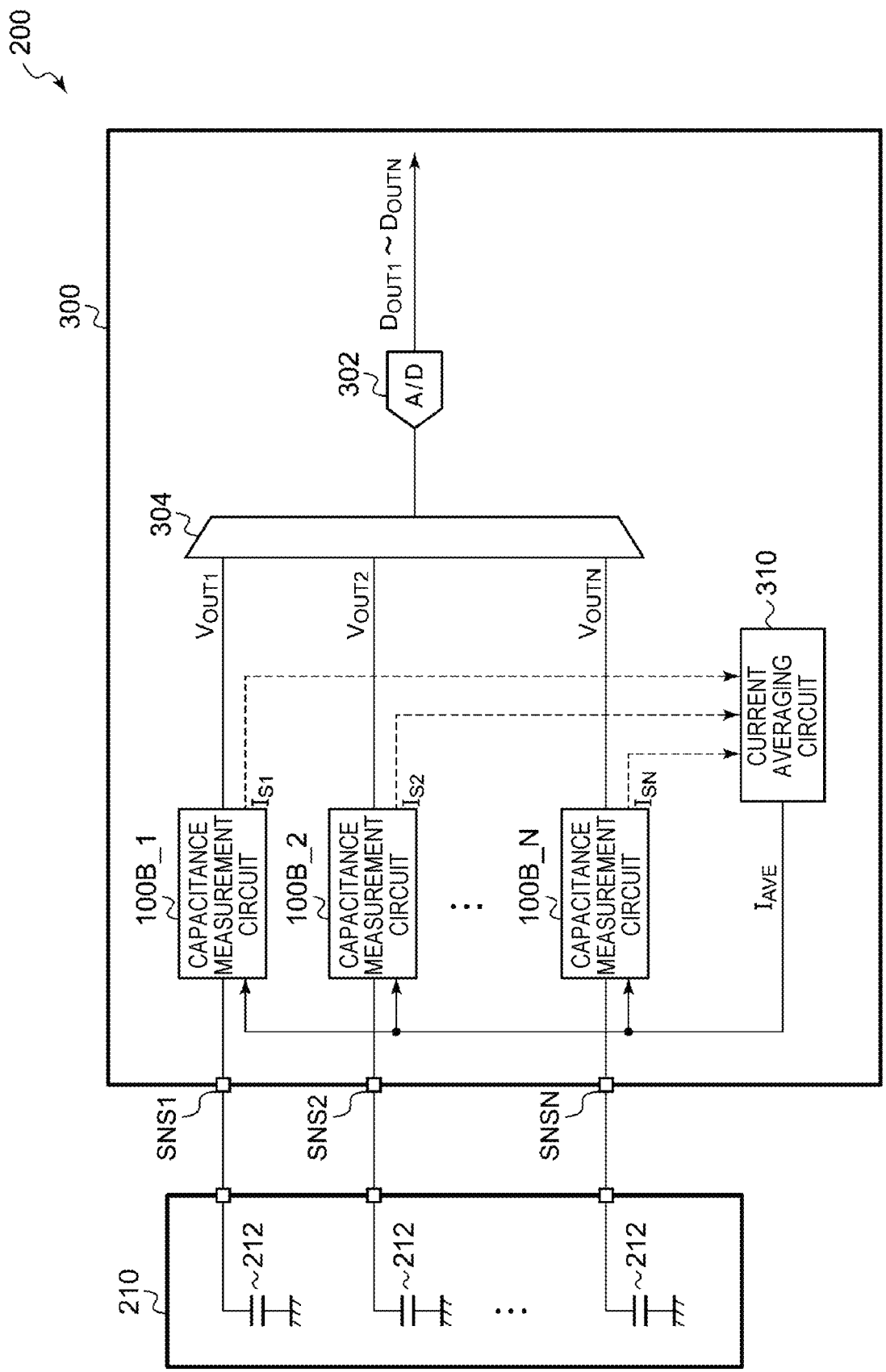
FIG. 10 is a view showing an input device including a capacitance detection circuit.

FIG. 10 is a view showing an input device 200 including a capacitance detection circuit 100B. The input device 200 includes a touch type sensor 210 and a semiconductor device 300. For example, the touch type sensor 210 may be a touch panel and the semiconductor device 300 may be a touch panel controller.

The touch type sensor 210 includes a plurality of sensor electrodes 212. The electrostatic capacitance Cs of the sensor electrodes 212 in the vicinity of the coordinates touched by a user changes. The semiconductor device 300 measures the electrostatic capacitance Cs of each of the plurality of sensor electrodes 212 and specifies the touched sensor electrode 212.

The semiconductor device 300 includes a plurality of sense terminals SNS, a plurality of capacitance detection circuits 100B, and an A/D converter 302.

A capacitance detection circuit 100B_# (#=1 to N) measures capacitance of the corresponding electrostatic capacitance Cs#. The A/D converter 302 converts an output voltage $V_{OUT}$# of the capacitance detection circuit 100B into a digital value.

The semiconductor device 300 further includes a current averaging circuit 310. The current averaging circuit 310 generates an average current $I_{AVE}$ of a plurality of detection currents $I_S$ obtained in the plurality of capacitance detection circuits 100B. The average current $I_{AVE}$ is returned to the plurality of capacitance detection circuits 100B.

The integrating circuit 140 of the capacitance detection circuit 100B# integrates a difference between the corresponding detection current $I_{S\#}$ and the average current $I_{AVE}$ to generate a detection voltage $V_{OUT}$#. The capacitance detection circuit 100B may basically include the capacitance detection circuit 100 of FIG. 3.

The detection voltages $V_{OUT1}$ to $V_{OUTN}$ are converted into digital values $D_{OUT1}$ to $D_{OUTN}$ by the A/D converter 302. A multiplexer 304 may be disposed in the front stage of the A/D converter 302 to switch channels in time division, thereby reducing the number of A/D converters 302.

The above is a configuration of the semiconductor device 300. When the number of channels N is large, regardless of the presence or absence of touch, the average value of the capacitances Cs1 to CsN of the plurality of sensor electrodes 212 can be approximated to be constant, so that the average current $I_{AVE}$ can be considered to be constant regardless of the presence or absence of touch. Therefore, a difference between the detection current $I_{S\#}$ and the average current $I_{AVE}$ is in accordance with the amount of variation from a value (reference value) in the non-touch state of the electrostatic capacitance Cs#, and the detection voltage $V_{OUT}$# represents the amount of variation from the reference value of the electrostatic capacity Cs#.

The average current $I_{AVE}$ can be used to detect the variation amount of the electrostatic capacitance Cs with high accuracy.

Figure 11:
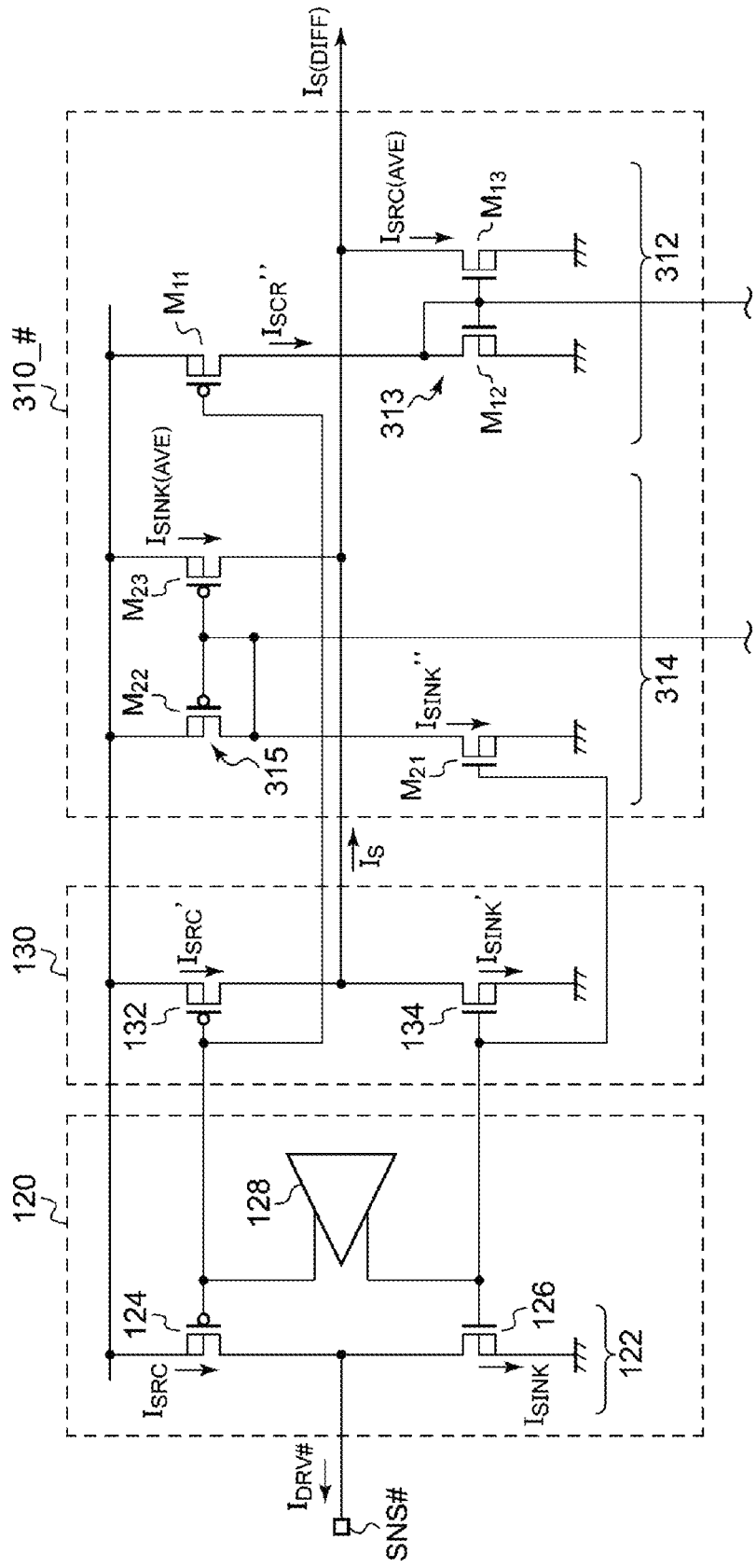
FIG. 11 is a circuit diagram of a part of a semiconductor device of FIG. 10.

FIG. 11 is a circuit diagram of a part of the semiconductor device 300 of FIG. 10. The current averaging circuit 310 includes a first circuit 312 for generating an average current $I_{SRC(AVE)}$ of source currents $I_{SRC}$ of the drive circuit 120, and a second circuit 314 for generating an average current $I_{SINK(AVE)}$ of sink currents $I_{SINK}$.

The first circuit 312 includes transistors $M_{11}$, $M_{12}$ and $M_{13}$. The control terminal of the transistor $M_{11}$ is connected in common with the control terminal of the high-side transistor 124, and generates a detection current $I_{SRC}$" proportional to the source current $I_{SRC}$. The detection current $I_{SRC}$" is supplied to an input side of a current mirror circuit 313 including the transistors $M_{12}$ and $M_{13}$. The control terminal (gate) of the current mirror circuit 313 is connected in common with the corresponding terminals of the other channels. As a result, an average current (source average current) $I_{SRC(AVE)}$ of detection currents $I_{SRC}$" of all the channels flows through the transistor $M_1$a at an output side of the current mirror circuit 313. The source average current $I_{SRC(AVE)}$ is sunk from the output node of the current detection circuit 130.

The second circuit 314 includes transistors $M_{21}$, $M_{22}$ and $M_{23}$. The control terminal of the transistor $M_{21}$ is connected in common with the control terminal of the low-side transistor 126, and generates a detection current $I_{SINK}$" proportional to the sink current $I_{SINK}$. The detection current $I_{SINK}$" is supplied to the input side of a current mirror circuit 315 including the transistors $M_{22}$ and $M_{23}$. The control terminal (gate) of the current mirror circuit 315 is connected in common with the corresponding terminals of the other channels. As a result, an average current (sink average current) $I_{SINK(AVE)}$ of detection currents $I_{SINK}''$ of all the channels flows through the transistor $M_{23}$ at the output side of the current mirror circuit 315. The sink average current $I_{SINK(AVE)}$ is sourced into the output node of the current detection circuit 130.

A differential current $I_{S(DIFF)}$ generated by the current detection circuit 130 and the current averaging circuit 310 is given by the following equation.

$$I_{S(DIFF)}=(I_{SRC}'-I_{SINK}')-(I_{SRC(AVE)}-I_{SINK(AVE)})$$

Here, the first term on the right side is the detection current $I_S=I_{SRC}'-I_{SINK}'$ of the drive current $I_{DRV}$. The second term on the right side is the average current $I_{S(AVE)}$ of the detection current $I_S$. Therefore, according to the configuration of FIG. 11, capacitance detection based on the differential current $I_{S(DIFF)}$ between a detection current $I_S$ and the average value $I_{S(AVE)}$ of detection currents $I_S$ of all the channels can be performed in each channel.

Figure 12:
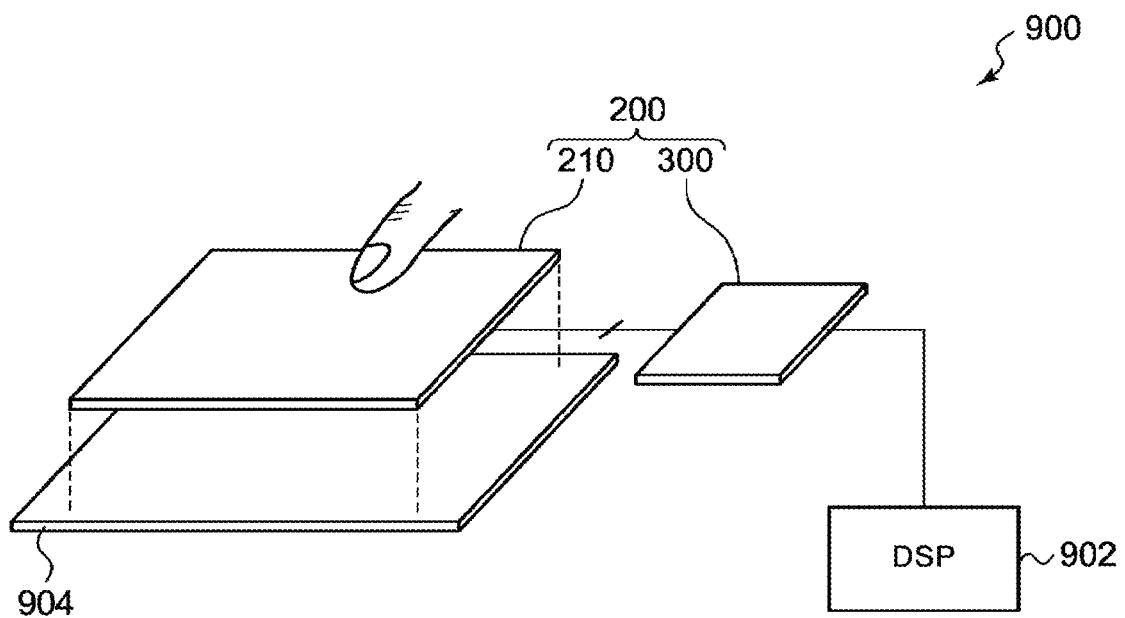
FIG. 12 is a block diagram of an electronic apparatus including the input device of FIG. 10.

FIG. 12 is a block diagram of an electronic apparatus 900 including the input device 200 of FIG. 10. Examples of the electronic apparatus 600 may include a mobile phone terminal, a personal computer, a tablet terminal, a digital still camera, a portable music player, a remote controller, and the like.

The electronic apparatus 900 includes, in addition to the input device 200, a DSP (Digital Signal Processor) 902 and an LCD (Liquid Crystal Display) 904. The input device 200 includes a touch type sensor 210 which is a touch panel, and a semiconductor device 300 which is a touch panel control IC. The touch type sensor 210 includes a plurality of regularly arranged sensor electrodes (not shown in FIG. 12). For example, the sensor electrodes include a plurality of X side electrodes extending in the Y direction and adjacent in the X direction, and a plurality of Y side electrodes extending in the X direction and adjacent in the Y direction. The semiconductor device 300 determines X coordinates of touched points based on the capacitance change of the plurality of X side electrodes, and determines Y coordinates of the touched points based on the capacitance change of the plurality of Y side electrodes. The coordinate information of the touched points is supplied to the DSP 902.

The present disclosure has been described above by way of embodiments. The disclosed embodiments are illustrative only. It should be understood by those skilled in the art that various modifications to combinations of elements or processes may be made and such modifications fall within the scope of the present disclosure. Such modifications will be described below.

In the above embodiments, the case where the capacitance detection circuit 100 is applied to an input device using the change in electrostatic capacitance has been described, but the usage of the capacitance detection circuit 100 is not limited thereto. For example, it may be applied to a microphone such as a capacitor type microphone in which a capacitor is formed by a diaphragm electrode and a back plate electrode and the electrostatic capacitance of the capacitor is changed by a sound pressure.

According to the present disclosure in some embodiments, it is possible to solve at least one of the above-mentioned problems.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A capacitance detection circuit for measuring an electrostatic capacitance, comprising:
   a control signal generator configured to generate a control signal;
   a drive circuit including:
      a push-pull type output stage, which is configured to apply a drive voltage to the electrostatic capacitance according to the control signal, and including a low-side transistor and a high-side transistor; and
      a differential input stage whose output terminals are connected to a control terminal of the low-side transistor and a control terminal of the high-side transistor, respectively, to apply output voltages to the control terminal of the high-side transistor and the control terminal of the low-side transistor, respectively, so that a feedback signal corresponding to an output voltage of the drive circuit matches the control signal;
   a current detection circuit configured to generate a detection current which is a replica of a current flowing through the output stage of the drive circuit, and including:
      a first transistor having a control terminal connected in common with the control terminal of the high-side transistor; and
      a second transistor having a control terminal connected in common with the control terminal of the low-side transistor; and
   an integrating circuit configured to integrate the detection current to generate a detection voltage,
   wherein the detection current depends on a difference between a current flowing through the first transistor and a current flowing through the second transistor.

2. The capacitance detection circuit of claim 1, wherein the control signal is a pulse signal, and
   wherein the drive circuit includes an amplifier configured to receive the pulse signal.

3. The capacitance detection circuit of claim 1, wherein the electrostatic capacitance is obtained by calculating a difference between the detection voltage obtained during charging and the detection voltage obtained during discharging.

4. The capacitance detection circuit of claim 1, wherein the integrating circuit integrates the detection current obtained during charging and the detection current obtained during discharging.

5. The capacitance detection circuit of claim 1, further comprising: an offset capacitor having one end connected to an input of the integrating circuit, and the other end to which a correction signal corresponding to the control signal is applied.

6. The capacitance detection circuit of claim 1, wherein the capacitance detection circuit is integrated on a single semiconductor integrated circuit.

7. The capacitance detection circuit of claim 1, wherein the differential input stage includes:
   a non-inverting input terminal to which the control signal, which is a pulse signal, generated by the control signal generator is input; and
   an inverting input terminal to which the drive voltage is input.

8. A semiconductor device for measuring a plurality of electrostatic capacitances, comprising:
- a plurality of sense terminals to which the plurality of electrostatic capacitances are connected; and
- a plurality of capacitance detection circuits corresponding to the plurality of sense terminals,
- wherein each of the plurality of capacitance detection circuits includes:
- a control signal generator configured to generate a control signal;
- a drive circuit including:
  - a push-pull type output stage, which is configured to apply a drive voltage to the electrostatic capacitances according to the control signal, and including a low-side transistor and a high-side transistor; and
  - a differential input stage whose output terminals are connected to a control terminal of the low-side transistor and a control terminal of the high-side transistor, respectively, to apply output voltages to the control terminal of the high-side transistor and the control terminal of the low-side transistor, respectively, so that a feedback signal corresponding to an output voltage of the drive circuit matches the control signal;
- a current detection circuit configured to generate a detection current which is a replica of a current flowing through the output stage of the drive circuit, and including:
  - a first transistor having a control terminal connected in common with the control terminal of the high-side transistor; and
  - a second transistor having a control terminal connected in common with the control terminal of the low-side transistor; and
- an integrating circuit configured to integrate the detection current to generate a detection voltage,
- wherein the detection current depends on a difference between a current flowing through the first transistor and a current flowing through the second transistor.

9. The semiconductor device of claim 8, further comprising: a current averaging circuit configured to generate an average current of a plurality of detection currents obtained by the plurality of capacitance detection circuits,
- wherein the integrating circuit of each of the capacitance detection circuits integrates a difference between the corresponding detection current and the average current.

10. An input device comprising:
- a touch panel including a plurality of sensor electrodes such that the electrostatic capacitances of a portion of the plurality of sensor electrodes in a vicinity of a coordinate touched by a user changes; and
- the semiconductor device of claim 8 that is configured to measure the electrostatic capacitances of the plurality of sensor electrodes.

11. An electronic apparatus comprising: the input device of claim 10.

12. The semiconductor device of claim 8, wherein the differential input stage includes:
- a non-inverting input terminal to which the control signal, which is a pulse signal, generated by the control signal generator is input; and
- an inverting input terminal to which the drive voltage is input.

13. A method of detecting an electrostatic capacitance, comprising:
- generating a control signal;
- charging and discharging the electrostatic capacitance according to the control signal by using a drive circuit including:
  - a push-pull type output stage, which is configured to apply a drive voltage to the electrostatic capacitance according to the control signal, and including a low-side transistor and a high-side transistor; and
  - a differential input stage whose output terminals are connected to a control terminal of the low-side transistor and a control terminal of the high-side transistor, respectively, to apply output voltages to the control terminal of the high-side transistor and the control terminal of the low-side transistor, respectively, so that a feedback signal corresponding to an output voltage of the drive circuit matches the control signal;
- generating a detection current which is a replica of a current of the output stage by using a current detection circuit including:
  - a first transistor having a control terminal connected in common with the control terminal of the high-side transistor; and
  - a second transistor having a control terminal connected in common with the control terminal of the low-side transistor; and
- generating a detection voltage by integrating the detection current,
- wherein the detection current depends on a difference between a current flowing through the first transistor and a current flowing through the second transistor.

14. The method of claim 13, wherein the control signal is a pulse signal, and
- wherein the drive circuit includes an amplifier configured to receive the pulse signal.

15. The method of claim 13, further comprising: calculating a difference between the detection voltage obtained during charging and the detection voltage obtained during discharging.

16. The method of claim 13, wherein the detection voltage is generated by integrating the detection current obtained during charging and the detection current obtained during discharging.

17. The method of claim 13, wherein the differential input stage includes:
- a non-inverting input terminal to which the control signal, which is a pulse signal, generated by a control signal generator is input; and
- an inverting input terminal to which the drive voltage is input.

* * * * *